(12) United States Patent
De Cremoux

(10) Patent No.: US 9,436,205 B2
(45) Date of Patent: Sep. 6, 2016

(54) APPARATUS AND METHOD FOR LOW VOLTAGE REFERENCE AND OSCILLATOR

(71) Applicant: Dialog Semiconductor GmbH, Kirchheim/Teck-Nabern (DE)

(72) Inventor: Guillaume De Cremoux, Edinburgh (GB)

(73) Assignee: Dialog Semiconductor (UK) Limited, Reading (GB)

( * ) Notice: Subject to any disclaimer, the term of this patent is extended or adjusted under 35 U.S.C. 154(b) by 0 days.

(21) Appl. No.: 14/166,904

(22) Filed: Jan. 29, 2014

(65) Prior Publication Data

US 2015/0205319 A1    Jul. 23, 2015

(30) Foreign Application Priority Data

Jan. 21, 2014   (EP) .................................... 14368015

(51) Int. Cl.
*H03L 7/099* (2006.01)
*G05F 3/26* (2006.01)
(Continued)

(52) U.S. Cl.
CPC ................. *G05F 3/262* (2013.01); *G05F 3/30* (2013.01); *H02M 3/1588* (2013.01); *H02M 3/18* (2013.01); *H03K 3/0231* (2013.01); *H03K 3/353* (2013.01)

(58) Field of Classification Search
CPC ..... H03K 3/0231; H03K 3/353; H02M 3/18; H02M 3/1588; G05F 3/262
USPC .................. 331/111, 143, 185; 323/269, 271
See application file for complete search history.

(56) References Cited

U.S. PATENT DOCUMENTS

| | | |
|---|---|---|
| 4,591,807 A | 5/1986 | Davis |
| 4,890,052 A | 12/1989 | Hellums |

(Continued)

OTHER PUBLICATIONS

European Search Report 14368015.5-1807, Aug. 29, 2014, Dialog Semiconductor GmbH.

(Continued)

*Primary Examiner* — Arnold Kinkead
(74) *Attorney, Agent, or Firm* — Saile Ackerman LLC; Stephen B. Ackerman

(57) ABSTRACT

An apparatus and method for a voltage reference circuit and oscillator which operates for a low voltage power supply. The voltage reference circuit is used in an "always on" mode of operation, and have low power usage. The operational range is 1.1V to 3.6 V, and must allow for sub-bandgap voltage conditions as well as voltage tolerant for higher voltages. The circuit minimizes the number of current branches by avoiding complexity of operational amplifiers and comparator networks. The circuit avoids stacking of more than 2 devices to allow for low voltage operation. The voltage reference circuit between a power supply node and a ground node and configured for generating a reference voltage comprises of a current mirror function providing matching and sourcing network branches, a voltage generator network sourced from a current mirror providing a base-emitter voltage, a current drive function network electrically sourced from a current mirror function, and an output network function sourced from a current mirror providing a voltage reference output voltage. An oscillator circuit between a power supply node and a ground node and configured for generating an oscillating signal comprises of a current mirror function providing matching and sourcing network branches, a current drive function network electrically sourced from said current mirror function, an output network function sourced from said current mirror providing a capacitors, current sources, a capacitor providing charge storage, and output network function, and, a feedback loop network providing reset function.

24 Claims, 9 Drawing Sheets

(51) Int. Cl.
*H02M 3/18* (2006.01)
*H03K 3/0231* (2006.01)
*H02M 3/158* (2006.01)
*G05F 3/30* (2006.01)
*H03K 3/353* (2006.01)

(56) References Cited

U.S. PATENT DOCUMENTS

| | | | |
|---|---|---|---|
| 5,982,201 | A | 11/1999 | Brokaw et al. |
| 7,663,351 | B2 * | 2/2010 | Korsunsky ............... 323/271 |
| 7,705,685 | B2 | 4/2010 | Ng et al. |
| 8,390,362 | B2 | 3/2013 | Motz |
| 2006/0091875 | A1 | 5/2006 | Kimura |
| 2009/0051342 | A1 | 2/2009 | Peng et al. |
| 2009/0102441 | A1 * | 4/2009 | de Cremoux et al. ........ 323/271 |
| 2010/0181985 | A1 | 7/2010 | Inoue et al. |
| 2013/0229238 | A1 | 9/2013 | Wadhwa |

OTHER PUBLICATIONS

"New Curvature-Compensation Technique for CMOS Bandgap Reference with Sub-1-V Operation," by Ming-Dou Ker et al., Nanoelectronics & 2005 IEEE, 0-7803-8834-8/05, May 2005, pp. 3861-3864.

"A Low Voltage CMOS Bandgap Reference without Using an Opamp," by Edward K. F. Lee, May 2009, IEEE, 978-1-4244-3828-0/09, pp. 2533-2536.

"Sub 1 V CMOS bandgap reference design techniques: a survey," by Christian Jesus B. Fayomi et al., Analog Integr Circ Process, Aug. 2009, 62:141-157, DOI 10.1007/s10470-009-9352-4, Springer.

"CMOS bandgap voltage reference circuit for supply voltages down to 0.6V," by T. Ytterdal, Electronics Letters, Oct. 2, 2003, vol. 39, No. 20, 2pgs.

"New Curvature-Compensation Technique for CMOS Bandgap Reference With Sub-1-V Operation," by Ming-Dou Ker et al., IEEE Transactions on Circuits and Systems-II: Express Briefs, vol. 53, No. 8, Aug. 2006, pp. 667-671.

"Curvature-Compensated BiCMOS Bandgap with 1-V Supply Voltage," by Piero Malcovati et al., IEEE Journal of Solid-State Circuits, vol. 36, No. 7, Jul. 2001, pp. 1076-1081.

"A DSP-Based Hearing Instrument IC," by Harry Neuteboom et al., IEEE Journal of Solid-State Circuits, vol. 32, No. 11, Nov. 1997, pp. 1790-1806.

"A CMOS Bandgap Reference Circuit with Sub-1-V Operation," by Hironori Banba et al., IEEE Journal of Solid-State Circuits, vol. 34, No. 5, May 1999, pp. 670-674.

* cited by examiner

APPARATUS AND METHOD FOR LOW VOLTAGE REFERENCE AND OSCILLATOR

BACKGROUND

1. Field

The disclosure relates generally to a voltage reference circuit and low voltage oscillator and, more particularly, to a system for a low power consumption thereof.

2. Description of the Related Art

Voltage reference circuits and oscillator circuits consume power which impacts the total system power consumption. Voltage reference circuits and oscillators are used in conjunction with semiconductor devices, integrated circuits (IC), and other applications. The requirement for a stable reference voltage is often required in electronic design. Voltage reference circuits that provide a stable reference voltage are sometimes bandgap voltage reference circuits.

A traditional bandgap reference circuit, the voltage difference between two p-n junctions (e.g. diodes, or bipolar transistors), operated at different current densities or at different transistor sizes, can be used to generate a proportional to absolute temperature (PTAT) current in a first resistor. This current can then be used to generate a voltage in a second resistor. This voltage, in turn, is added to the voltage of one of the junctions. The voltage across a diode operated at a constant current, or herewith a PTAT current, is complementary to absolute temperature (CTAT). If the ratio between the first and second resistor is chosen properly, the first order effects of the temperature dependency of the diode and the PTAT current will cancel out. In this fashion, a circuit can be independent of temperature variation, and provide a constant voltage reference.

Circuits of this nature that are temperature insensitive are referred to as bandgap voltage reference circuits. The resulting voltage is about 1.2-1.3V, depending on the particular technology and circuit design, and is close to the theoretical silicon bandgap voltage of 1.22 eV at 0 degrees Kelvin. The remaining voltage change over the operating temperature of typical integrated circuits is on the order of a few millivolts. Because the output voltage is by definition fixed around 1.25V for typical bandgap reference circuits, the minimum operating voltage is about 1.4V. A circuit implementation that has this characteristic is called a Brokaw bandgap reference circuit.

In voltage reference circuits, operation below the bandgap voltage level is desirable. These voltage reference circuits are known as sub-bandgap voltage references. Technology scaling of the physical dimensions of integrated electronics allows for higher density circuits. To maintain reliability of semiconductor components, dimensional technology scaling also requires scaling of the power supply voltage. This is known as constant electric field scaling theory. But, with the technology scaling, silicon remains the most commonly used technology. Hence, voltage reference circuits with power supply voltages as low 1.1 V will require sub-bandgap operation.

With mixed voltage interfaces, it is also desirable to provide voltage reference circuits and oscillators above the bandgap voltage level. Voltage reference circuits and oscillators that operate to 3.6V power supply levels are also needed. Systems power supply rail voltages can range from 1.1V to 3.6V. In semiconductor technologies, typically having at least two transistors, with different MOSFET gate oxide thickness, typically referred to as thin-oxide MOSFET and thick oxide MOSFET. The thick oxide MOSFET uses dual oxide, or triple oxide thicknesses to provide higher power supply voltage tolerance for higher voltage operation and applications. Voltage tolerance for circuits can also be achieved by using "stacks" of MOSFETs (for example cascode MOSFET circuits) to lower the voltage across any given thin-oxide MOSFET transistor.

In some system applications, voltage reference and oscillators can be turned on, and turned off, sequence dependent, sequence independent, as well as "always on" systems. In the case of an "always on" system, power consumption is an issue. It is desirable to have voltage reference and oscillators in an "always on" state which has a low power consumption. A target level for low power consumption is typically 3 μA for the portable business.

A prior art sub-bandgap voltage reference is depicted in FIG. 1. A low voltage power supply rail voltage $V_{CC}$ 10 and a ground rail 20 provides power to the circuit. The voltage reference output 30 is between the power supply voltage and the ground potential. The differential amplifier 40 supplies an output voltage to the gates of p-channel MOSFET P1 50A, P2 50B, and P3 50C. The p-channel MOSFET P1 50A drain is connected to the parallel combination of resistor R1 60, and diode 70. The p-channel MOSFET P2 50B is connected to an array of diode elements 80 and a resistor R3 90. A second resistor R2 95 is in parallel with the array of diodes 80 and resistor R3 90. The output reference voltage 30 is electrically coupled to the p-channel transistor P3 50C and resistor element R4 97.

In the prior art circuit of FIG. 1, the technology that is used only allows for a "stack" of one MOSFET gate-to-source voltage, VGS, and one MOSFET drain-to-source voltage, VDS for a low voltage rail. Furthermore, the power supply rail is as low as 1.1V, traditional bandgap voltage reference networks can not be used. Different implementations can not only use this network, but also operational amplifiers. Operational amplifier circuit topologies always need a at least one MOSFET drain-to-source voltage, VDS, for tail current generation, one MOSFET drain-to-source voltage, VDS, for the V-mode comparison, and one MOSFET gate-to-source voltage for the output p-channel MOSFET (PMOS) to drive. As a result, these structures are not suitable for a minimum power supply voltage of 1.1V. Operational amplifier circuits add significant increase in the number of circuit branches, leading to more complexity, more complications, and more power consumption.

For oscillator circuits, low power consumption and accuracy are important design objectives. FIG. 2 illustrates a relaxation oscillator circuit. The circuit is powered by VCC 150. A comparator 100 evaluates two incoming signals from the voltage on a capacitor VC 105 with respect to a reference voltage VREF 110. The current reference IREF 120 provides current for the charging of the capacitor C 140. A switch 130 is activated by a feedback loop from the COMPOUT (oscillator out signal) 160. The switch 130 is in parallel with capacitor 140. The comparator adds at least four branches to the circuit (e.g. a differential pair, a bias and an output stage). Additionally, it requires a voltage of a MOSFET gate-to-source voltage VGS, and two MOSFET drain-to-source voltages, 2 VDS, to operate properly. Hence, this limits the ability to use this circuit for sub-bandgap voltages, and low voltage applications. The generation of IREF 120 requires an extra operational amplifier to divide the voltage reference by a resistance of value R. Hence, the oscillator introduces a number of current branches increasing the complexity of the network.

With technology scaling, according to constant electric field scaling theory, the power supply voltage, $V_{DD}$, continues to decrease to maintain dielectric reliability. In current and future semiconductor process technology, having minimum dimensions of, for example, 0.18 µm, and 0.13 µm, the native power supply voltage (or internal power supply voltage) is 1.5V internal supply voltage for digital circuits, and other sensitive analog circuitry. For technologies whose minimum dimension is below 0.13 µm, the issue is also a concern.

In oscillators, a low voltage wide frequency oscillator has been described. As discussed in U.S. Patent Application US 2013/0229238 to Wadhwa describes a low voltage oscillator that is controlled by latch networks. The implementation includes multiple delay elements, in which each delay element includes two inverters, a control input, a plurality of delay elements, a latching element, and a plurality of current-source devices.

Low power oscillators have been disclosed. As discussed in U.S. Pat. No. 8,390,362 to Motz et al, a low power, high voltage integrated circuit allows for both low power, and high voltage in a given implementation. The circuit controls a sleep/wake mode, or a duty cycle.

Low voltage oscillators can utilize capacitor-ratio selectable duty cycle. As discussed in U.S. Pat. No. 7,705,685 to Ng et al., discloses an oscillator operating at very low voltage yet has a duty cycle set by a ratio of capacitors, with an S-R flip-flop latch that drives the oscillator inputs.

Low voltage bandgap voltage references utilize low voltage operation. As discussed in U.S. Pat. No. 5,982,201 to Brokaw et al., a low voltage current mirror based implementation shows a bipolar current mirror network, a resistor divider network, an output transistor that allows for operation with supply voltages of less than two junction voltage drops.

A low voltage oscillator can also have oscillation frequency selection. As discussed in U.S. Pat. No. 4,591,807 to Davis, describes a low power, fast startup oscillator circuit comprising of an amplifier, a current mirror, a feedback biasing means, and a tuned circuit for selecting the frequency of oscillation.

In these prior art embodiments, the solution to improve the operability of a low voltage bandgap circuit and oscillators utilized various alternative solutions.

It is desirable to provide a solution to address the disadvantages of the low voltage operation of a bandgap reference circuits and oscillators.

SUMMARY

A principal object of the present disclosure is to provide a voltage reference circuit which allows for operation for low power supply voltages.

A principal object of the present disclosure is to provide an oscillator circuit which allows for operation for low power supply voltages.

A principal object of the the present disclosure is to provide a voltage reference and oscillator circuit that is always "on."

Another further object of the present disclosure is to provide a voltage reference circuit and oscillator that operate in the range of 1.1V to 3.6V.

Another further object of the present disclosure is provide a voltage reference and oscillator circuits that consumes low power and is voltage tolerant to higher power supply voltages.

Another further object of the present disclosure is to provide a voltage reference and oscillator circuit which simplifies the network with reduction of the number of current branches.

Another further object of the present disclosure is to provide a voltage reference and oscillator circuit which avoids stacking of more than two circuit elements allowing for lowering of the power supply voltage.

As such, a sub-bandgap reference circuit and oscillator circuit with an improved operation for low power supply voltages is disclosed.

In summary, a voltage reference circuit between a power supply node and a ground node and configured for generating a reference voltage comprising a current mirror function providing matching and sourcing network branches, a voltage generator network sourced from said current mirror providing a base-emitter voltage, a current drive function network electrically sourced from said current mirror function, and an output network function sourced from said current mirror providing a voltage reference output voltage.

In addition, a voltage reference circuit with improved operation at low voltage power supply is disclosed, where the voltage reference circuit between a power supply node and a ground node and configured for generating a reference voltage, and a current mirror function providing matching and sourcing network branches, a voltage generator-current mirror replica function network sourced from a current mirror providing a base-emitter voltage, a current drive function network electrically sourced from the current mirror function, and a current feedback sub-loop function, and an output network function sourced from the current mirror providing a voltage reference output voltage electrically coupled to the current feedback sub-loop function.

In addition, an oscillator circuit is disclosed. An oscillator circuit between a power supply node and a ground node and configured for generating an oscillating signal, and a current mirror function providing matching and sourcing network branches, a current drive function network electrically sourced from said current mirror function, an output network function sourced from said current mirror providing a capacitor oscillator output voltage, a first pull-up current source connected to said current drive function, a second pull-up current source connected to an output network function, and output network function, and lastly, a feedback loop network providing reset function.

In addition, a second embodiment of an oscillator is disclosed. An oscillator circuit between a power supply node and a ground node and configured for generating an oscillating signal, comprising a current mirror function providing matching and sourcing network branches, a current drive function network electrically sourced from the current mirror function, a first output network function sourced from the current mirror providing a first capacitor oscillator output voltage, a second output network function sourced from the current mirror providing a second capacitor oscillator output voltage, a first pull-up current source connected to said current drive function, a second pull-up current source connected to a first output network function, a third pull-up current source connected to a second output network function, a first capacitor providing charge storage and a first output network function, a second capacitor providing charge storage and a second output network function, a S-R flip-flop whose inputs are from said first output network function and the second output network function, a first feedback loop network connected to said first output of said S-R flip-flop providing reset function for a first switch, and a second feedback loop network connected to the second output of the S-R flip-flop providing reset function for a second switch.

In addition, a method of a voltage reference circuit is comprising the following steps: a first step of providing a voltage reference circuit between a power supply node and a ground node comprising a current mirror function, a voltage generator network, a current drive function network, and an output network function, a second step of providing matching and sourcing network branches from said current mirror function, a third step of providing a base-emitter voltage from said voltage generator network, and a fourth step of providing a voltage reference output voltage.

In addition, a method of an oscillator circuit is comprising the following steps: a first step providing an oscillator comprising of a power supply node, a ground node, a oscillating signal a current mirror function, a current drive function network, an output network function, a first pull-up current source, a second pull-up current source, a capacitor, and a feedback loop, a second step of providing matching and sourcing network branches using a current mirror function, a third step of sourcing a current from a current drive function network, a fourth step of sourcing current to a capacitor from an output network function, a fifth step of sourcing current from the first pull-up current source, a sixth step of sourcing current from said second pull-up current source, a seventh step of providing charge storage using a capacitor, and an eighth step of resetting the capacitor voltage providing a feedback loop network reset function.

Other advantages will be recognized by those of ordinary skill in the art.

BRIEF DESCRIPTION OF THE DRAWINGS

The present disclosure and the corresponding advantages and features provided thereby will be best understood and appreciated upon review of the following detailed description of the disclosure, taken in conjunction with the following drawings, where like numerals represent like elements, in which.

DETAILED DESCRIPTION

Figure 1:
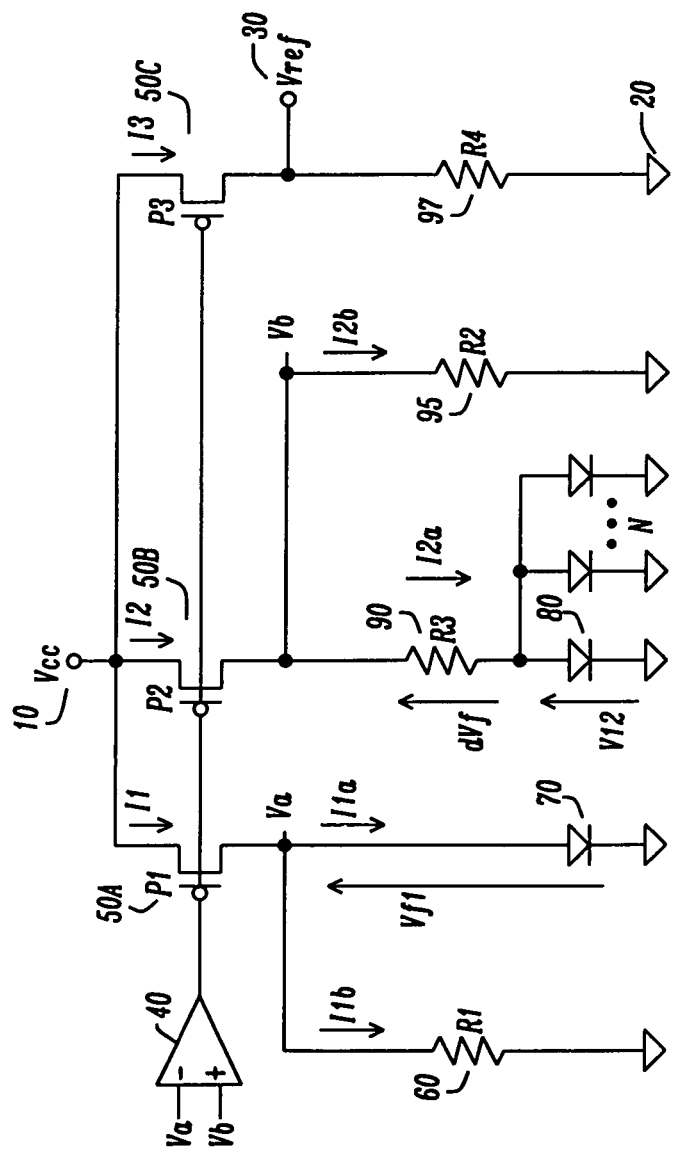
FIG. 1 is a prior art example of a current mode sub-bandgap voltage reference circuit.

FIG. 1 is a prior art example of a current mode sub-bandgap voltage reference circuit. A low voltage power supply rail voltage $V_{CC}$ 10 and a ground rail 20 provides power to the circuit. The voltage reference output 30 is between the power supply voltage and the ground potential. The differential amplifier 40 supplies an output voltage to the gates of p-channel MOSFET P1 50A, P2 50B, and P3 50C. The p-channel MOSFET P1 50A drain is connected to the parallel combination of resistor R1 60, and diode 70. The p-channel MOSFET P2 50B is connected to an array of diode elements 80 and a resistor R3 90. A second resistor R2 95 is in parallel with the array of diodes 80 and resistor R3 90. The output reference voltage 30 is electrically coupled to the p-channel transistor P3 50C and resistor element R4 97.

In the prior art circuit of FIG. 1, the technology that is used only allows for a "stack" of one MOSFET gate-to-source voltage, VGS, and one MOSFET drain-to-source voltage, VDS for a low voltage rail. Furthermore, the power supply rail is as low as 1.1V, traditional bandgap voltage reference networks can not be used. Different implementations can not only use this network, but also operational amplifiers. Operational amplifier circuit topologies always need a at least one MOSFET drain-to-source voltage, VDS, for tail current generation, one MOSFET drain-to source voltage, VDS, for the V-mode comparison, and one MOSFET gate-to-source voltage VGS for the output PMOS. As a result, these structures are not suitable for a minimum power supply voltage of 1.1V. Operational amplifier circuits add significant increase in the number of circuit branches, leading to more complexity, more complications, and more power consumption.

Figure 2:
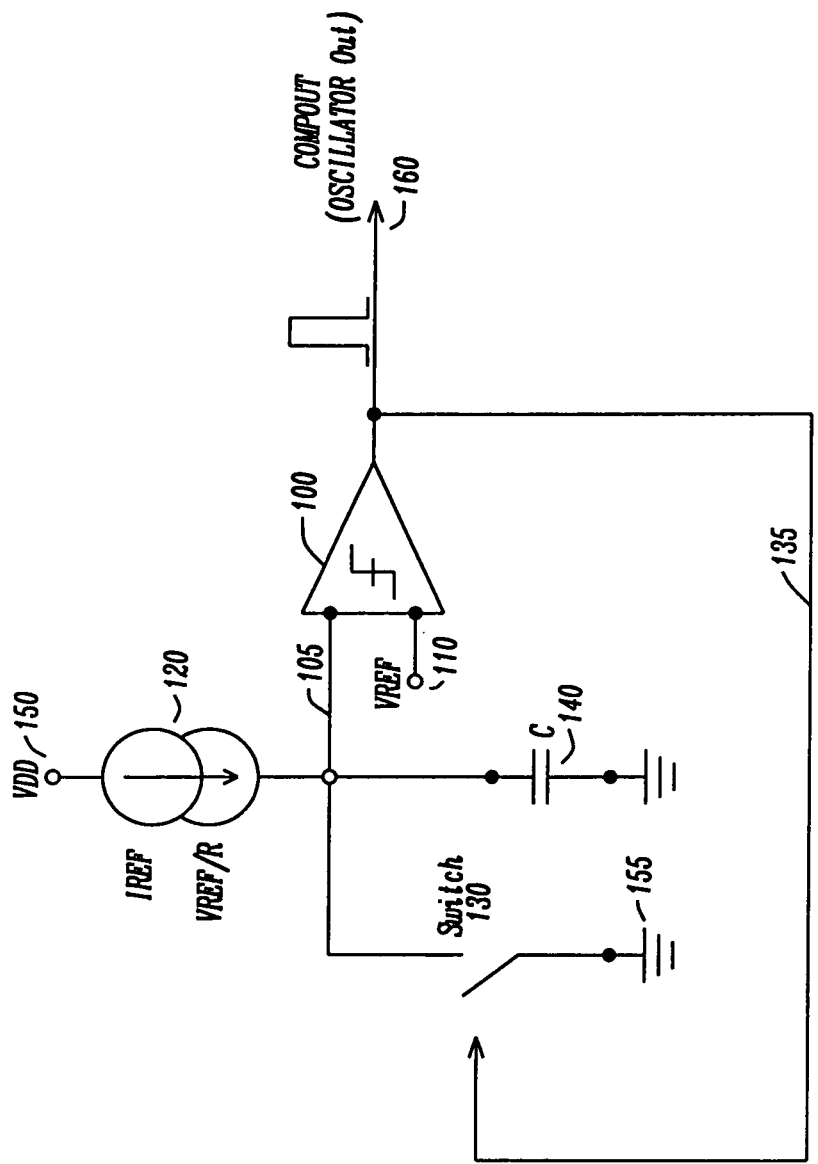
FIG. 2 is a prior art example circuit schematic of a single branch relaxation oscillator.

FIG. 2 is a prior art example circuit schematic of a single branch relaxation oscillator. The circuit is powered by VDD 150. A comparator 100 evaluates two incoming signals from the voltage on a capacitor VC 105 with respect to a reference voltage VREF 110. The current reference IREF 120 provides current for the charging of the capacitor C 140. A switch 130 is activated by a feedback loop from the COMPOUT (oscillator out signal) 160. The switch 130 is in parallel with capacitor 140. The comparator adds at least four branches to the circuit (e.g. a differential pair, a bias and an output stage). Additionally, it requires a voltage of a MOSFET gate-to-source voltage VGS, and two MOSFET drain-to-source voltages, 2 VDS, to operate properly. Hence, this limits the ability to use this circuit for sub-bandgap voltages, and low voltage applications. The generation of IREF 120 requires an extra operational amplifier to divide the voltage reference by a resistance of value R. Hence, the oscillator introduces a number of current branches increasing the complexity of the network.

Figure 3:
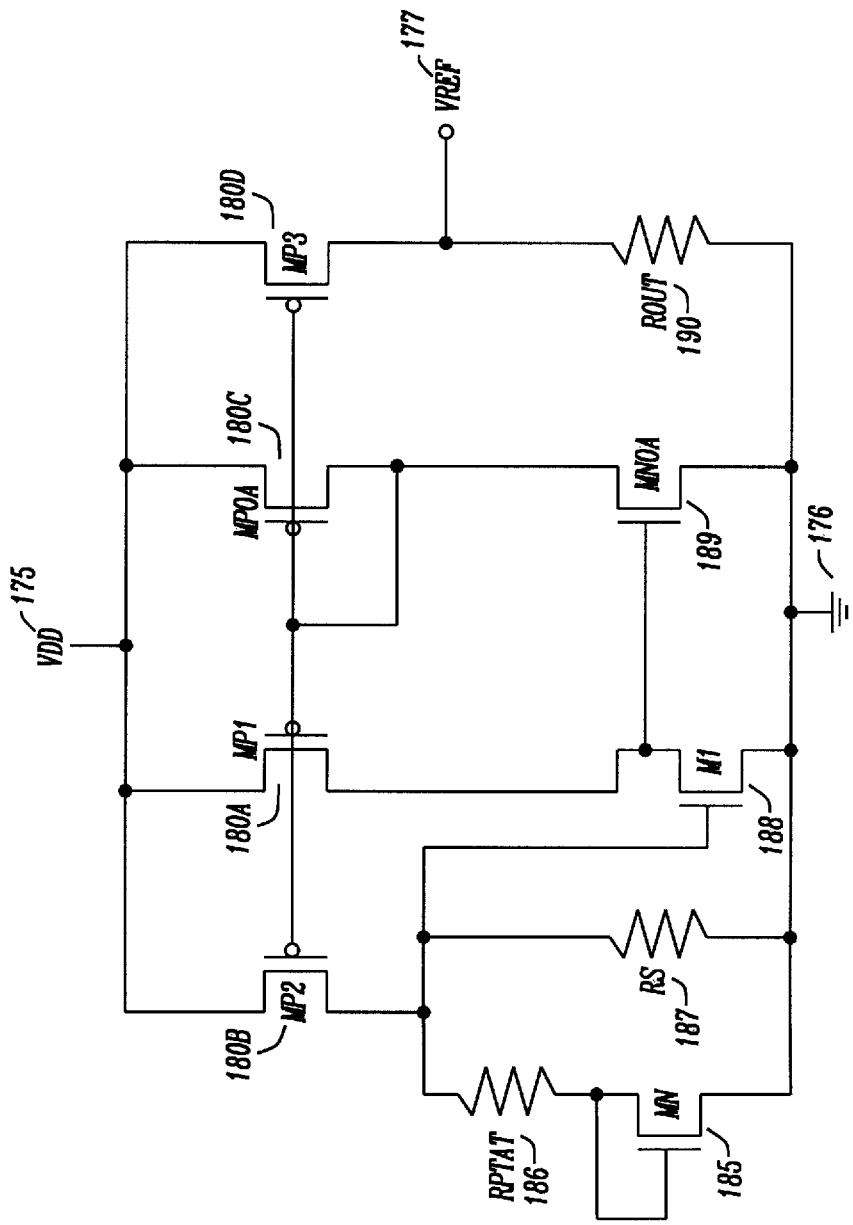
FIG. 3 is a circuit schematic of a low voltage reference in accordance with a first embodiment of the disclosure.

FIG. 3 is a circuit schematic of a low voltage reference in accordance with a first embodiment of the disclosure. The voltage reference output value VREF 177 is between the power supply VDD 175 and ground rail VSS 176. The current I1 is supported by the p-channel MOSFET MP1 180A, which forms a current mirror with p-channel MOSFET MPOA 180C. The current I2 is supported by the p-channel MOSFET MP2 180B, and the current I3 is supported by p-channel MOSFET MP3 180D. The MOSFET gate electrode of MPOA 180C, MP1 180A, MP2 180B, and MP3 180D are all connected. Two branches are matched for the current using the mirror MP1 and MP2.

The n-channel MOSFET M1 188 establishes a VBE1, and whose gate voltage is designated as VGN. N-channel MOSFET 185 establishes a voltage VBEN. The first and second n-channel MOSFET transistors, M 188 and MN 185 are of different physical size. The transistor MN 185 is N times wider than M1 188. Given the MN 185 and M1 188 operate in weak inversion, the bipolar transistor current-voltage law can be applied. The n-channel MOSFET MN 185 gate electrode is connected to the drain, and whose source is electrically connected to the ground rail 176. Current I2 flows into the resistor RPTAT 186 and RS 187. The resistor RPTAT 186 is electrically connected to the MOSFET gate and drain of n-channel MOSFET MN 185. The resistor RPTAT 186 establishes a proportional to absolute temperature (PTAT) for the voltage reference network. The n-channel MOSFET M1 188 drain is electrically connected to the MOSFET gate of MNOA 189. An output resistor ROUT 190 is connected to the output VREF 177.

Two branches are matched for the current using the mirror MP1 180A and MP2 180B. Given that the identical resulting currents I1 and I2 are small, the current I2 is not large enough to pull up the gate of transistor M1 188 (e.g. gate voltage VGN). In this condition, transistor M1188 does not lead to a high current drive. As consequence, the drain of transistor M1 188 rises, and transistor MNOA 189 turns on, driving a significant amount of current through transistor MPOA 180C; this leads to an increase in the current flow increasing the current flow in current I1 and current I2.

This system thus reaches a steady, regulated state where VGN is VBE1. Whereas the transistor M1 188 is a MOSFET transistor, it is labeled VBE1 to imply bipolar-like operation in weak inversion (e.g. it is deliberately called VBE1 to remind that M1 188 and MN 185 operate in weak-inversion, so close to the behavior of NPN). As a result, the regulating system is reduced to the single branch {MNOA 189, MPOA 180C}. This operational state simplifies the solution, and is a significant reduction from prior art operational amplifier-type solutions.

The current I2 can be expressed as $$I2=(VBE1(I1)/RS)+(VBE1(I1)-VBEN(I2-VBE1(I1)/RS))/RPTAT \quad (1),$$

where we name VBE1(I1): voltage on the gate-source of the transistor M1 188 biased at the current I1. There is at this step an important approximation, where voltage VBE1(I1)/RS is neglected compared to current I2, $$I2-VBE1(I1)/RS \sim I2=I1$$

and finally the equation (1) can be written as $$I2=(VBE1(I1)/RS)+\Delta VBE/RPTAT \quad (2).$$

ΔVBE is the PTAT voltage, obtained from the approximation.

With the mirroring function, the current I2 is then copied into the current I3 and injected into ROUT. This leads to the temperature compensated reference:

$$VREF=(ROUT/RS)\cdot VBE1+(ROUT/RPTAT)\Delta VBE$$

In the embodiment in this disclosure, there are typically twice less branches than for the prior art. Additionally, each branch does not require more voltage than the sum of the gate-to-source voltage and the drain-to-source voltage (VGS+VDS).

Alternative implementations are possible for the PTAT. The PTAT {M1, RPTAT, MN, RS} can include the stacking another NX-transistor in series with RS to change the temperature compensation, or use another type of transistors for M1, MN. Transistors M1 188 and MN 185 can be bipolar junction transistors (BJT) instead of MOSFET transistors.

Figure 4:
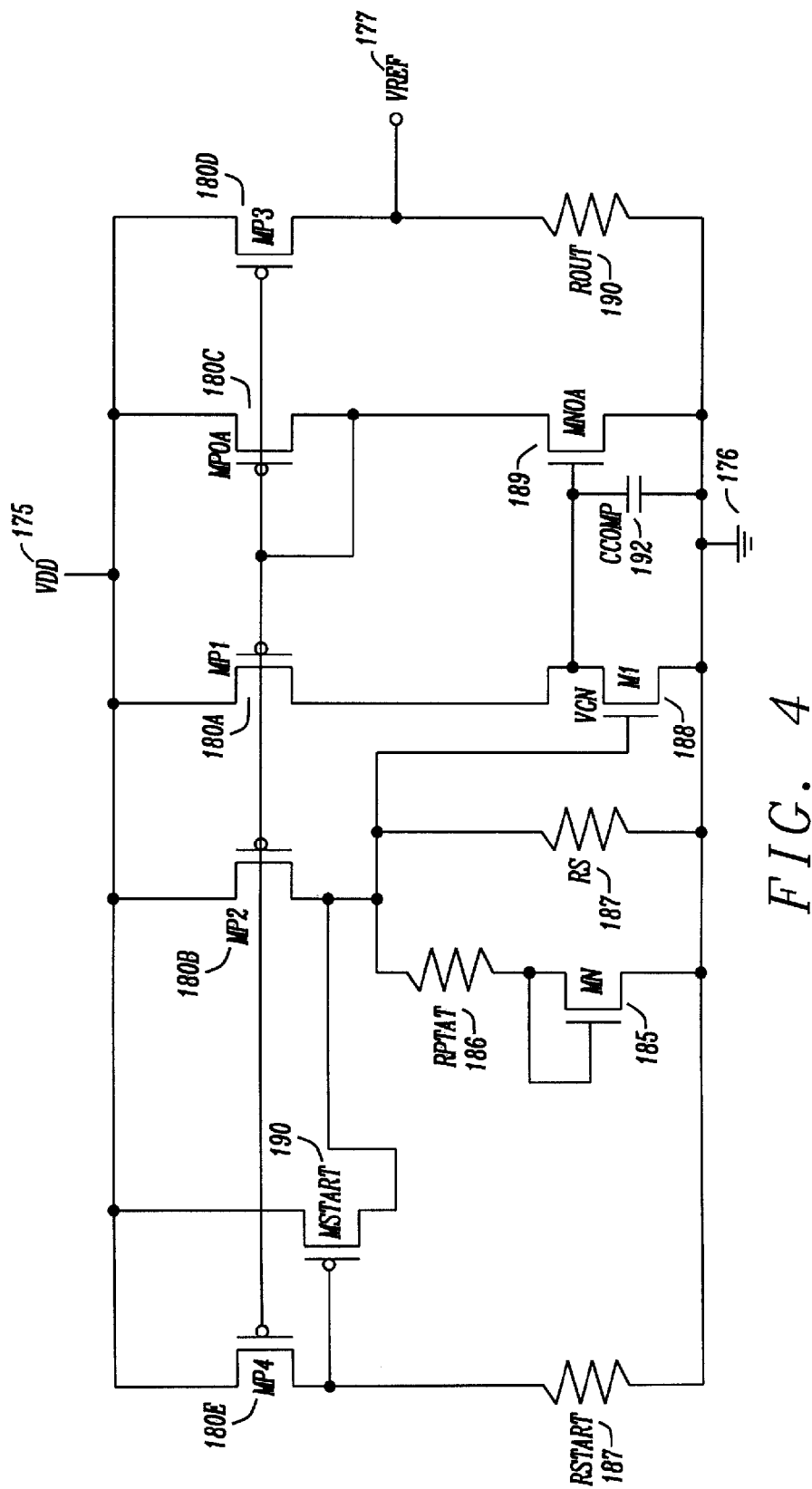
FIG. 4 is a circuit schematic of a low voltage reference in accordance with a second embodiment of the disclosure.

FIG. 4 is a circuit schematic of a low voltage reference in accordance with a second embodiment of the disclosure. The voltage reference output value VREF 177 is between the power supply VDD 175 and ground rail VSS 176. The current is supported by the p-channel MOSFET MP1 180A, which forms a current mirror with p-channel MOSFET MPOA 180C. Additionally, currents is supported by the p-channel MOSFET MP2 180B, and by p-channel MOSFET MP3 180D. In this embodiment, an additional transistor MOSFET MP4 180E is required for a "startup" circuit function. The MOSFET gate electrode of MPOA 180C, MP1 180A, MP2 180B, MP3 180D, and MP4 180E are all connected. Two branches are matched for the current using the mirror MP1 and MP2.

The n-channel MOSFET M1 188 establishes a VBE1, and whose gate voltage is designated as VGN. N-channel MOSFET 185 establishes a voltage VBEN. The first and second n-channel MOSFET transistors, M1 188 and MN 185 are of different physical size. The transistor MN 185 is N times wider than M1 188. Given the MN 185 and M1 188 operate in weak inversion, the bipolar transistor current-voltage law can be applied. The n-channel MOSFET MN 185 gate electrode is connected to the drain, and whose source is electrically connected to the ground rail 176. Current flows into the resistor RPTAT 186 and RS 187. The resistor RPTAT 186 is electrically connected to the MOSFET gate and drain of n-channel MOSFET MN 185. The resistor RPTAT 186 establishes a proportional to absolute temperature (PTAT) for the voltage reference network. The n-channel MOSFET M1 188 drain is electrically connected to the MOSFET gate of MNOA 189. An output resistor ROUT 190 is connected to the output VREF 177.

A startup system comprises of p-channel MOSFET MP4 180E connected to power supply voltage VDD 175. The startup system utilizes a p-channel MOSFET MSTART 190 whose gate is connected to the drain of MP4 180E, a device element RSTART 191, whose source is connected to the power supply voltage VDD 175 and whose gate is connected to transistor M1 188. The startup system is added to force the electrical circuit to choose its stable, non-zero bias state (the other stable state being all the branches at I=0). As long as the system has not started, MP4 180E, that copies I1 and I2, drives no current and device element RSTART 191 sinks the gate of the PMOS MSTART 190. This PMOS 190 is "on" and charges the gate of MNOA (single-branch operational amplifier) 189. Once the system is active, RSTART 191 is sized to deactivate MSTART 190. A compensation capacitor CCOMP 192 is a compensation capacitor set on the highest impedance node to ensure the stability of both the main loop and the startup loop. In this embodiment, device element RSTART 191 can be other circuit elements that provide the same functional equivalence, such as a current source. The device element RSTART 191 can be an inherent resistor, parasitic resistor, and/or a current source.

Figure 5:
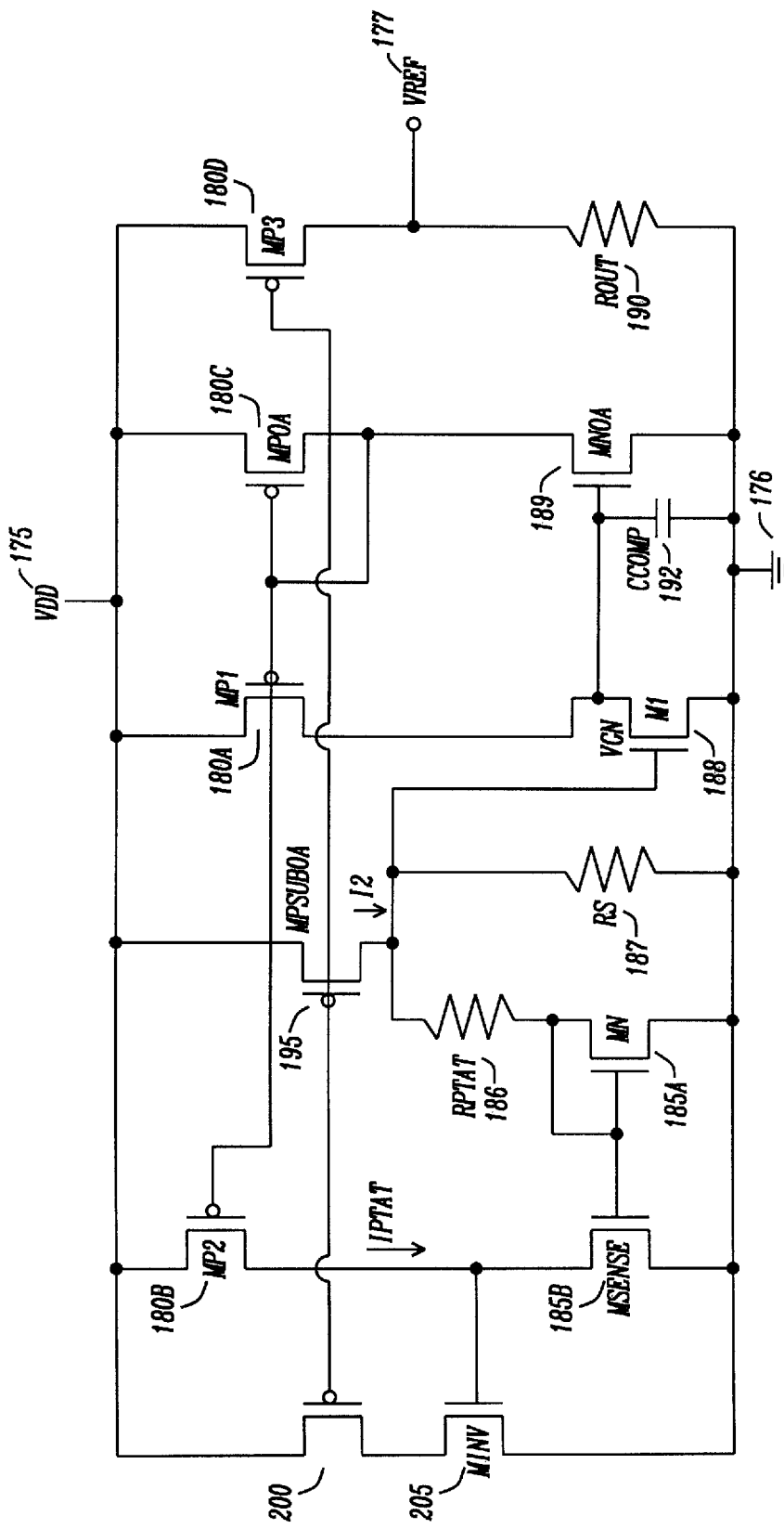
FIG. 5 is a circuit schematic of a low voltage reference in accordance with a third embodiment of the disclosure.

FIG. 5 is a circuit schematic of a low voltage reference in accordance with a third embodiment of the disclosure. This third embodiment is aimed at avoiding the approximation done used in the prior equations of the first and second embodiments. It is worth noting that this previous approximation results in a non-ideal ΔVBE, and thus a degradation of the temperature behavior. The reference circuit of the FIG. 3, over all the corners (process, temperature), has a total spread of [−10%; +10%].

The voltage reference output value VREF 177 is between the power supply VDD 175 and ground rail VSS 176. The current is supported by the p-channel MOSFET MP1 180A, which forms a current mirror with p-channel MOSFET MPOA 180C. Additionally, currents is supported by the p-channel MOSFET MP2 180B. P-channel MOSFET MP3 180D is connected to the power supply voltage, and whose drain is connected to VREF 177, and output resistor ROUT 190. The MOSFET gate electrode of MPOA 180C, MP1 180A, MP2 180B, MP3 are all connected. The gate of MOSFET MP3 is connected to MOSFET MPSUBOA 195 and p-channel MOSFET 200. The voltage on the gate of MPSUBOA is designated as VGSUBOA. P-channel MOSFET 200 drain and gate are connected to n-channel MOSFET MINV 205. The MOSFET MINV 205 source is connected to ground 176, and whose gate is connected to MP2

180B and a sense transistor MSENSE 185B. The transistor MSENSE 185B and MN 185A form a current mirror network.

The n-channel MOSFET M1 188 establishes a VBE1, and whose gate voltage is designated as VGN. N-channel MOSFET 185A establishes a voltage VBEN. The first and second n-channel MOSFET transistors, M1 188 and MN 185A are of different physical size. The transistor MN 185A is N times wider than M1 188. Given the MN 185A and M1 188 operate in weak inversion, the bipolar transistor current-voltage law can be applied. The n-channel MOSFET MN 185A gate electrode is connected to the drain, and whose source is electrically connected to the ground rail 176. Current flows into the resistor RPTAT 186 and RS 187. The resistor RPTAT 186 is electrically connected to the MOSFET gate and drain of n-channel MOSFET MN 185A. The resistor RPTAT 186 establishes a proportional to absolute temperature (PTAT) for the voltage reference network. The n-channel MOSFET M1 188 drain is electrically connected to the MOSFET gate of MNOA 189. An output resistor ROUT 190 is connected to the output VREF 177.

So as to match exactly the currents in MN 185A and in M1 188 (and thus being able to create an exact ΔVBE), the current through MN 185A is sensed by copying it (possibly with a scaling factor) using MSENSE 185B. The result (IPTAT) is then compared to a replica of the current through M1 188 (mirror MP1 180A, MP2 180B). If I(MN) is too low, then the gate of MINV 205 is pulled up, thus increasing the current through MPSUBOA 195 (sub-operational amplifier that makes a local loop). Eventually, the current I2 becomes $$VBE1(I1)/RS+(VBE1(I1)-VBEN(I1))/RPTAT,$$

and this is the new current needing to be copied to the output. The results is $$VREF=(ROUT/RS)\cdot VBE1+(ROUT/RPTAT)\Delta VBE$$

This time this is a true ΔVBE, and the total accuracy [−5%; +5%] reflects this second-order correction. However, it is worth noting that the two loops are competing. The sub-loop needs to be much faster than the main loop so that when MNOA slowly adjusts I1, then I2 spontaneously reaches its value to match IPTAT with I1. If not, the sub-loop is an extra pole and degrades the stability of the main loop. Two solutions for the embodiment can be applied:

(1) Increase the current budget in the sub-loop to increase its speed
(2) Use an external compensation for the main loop to make it much slower.

This embodiment, although intrinsically more precise, has less integration and standby advantages.

Figure 6:
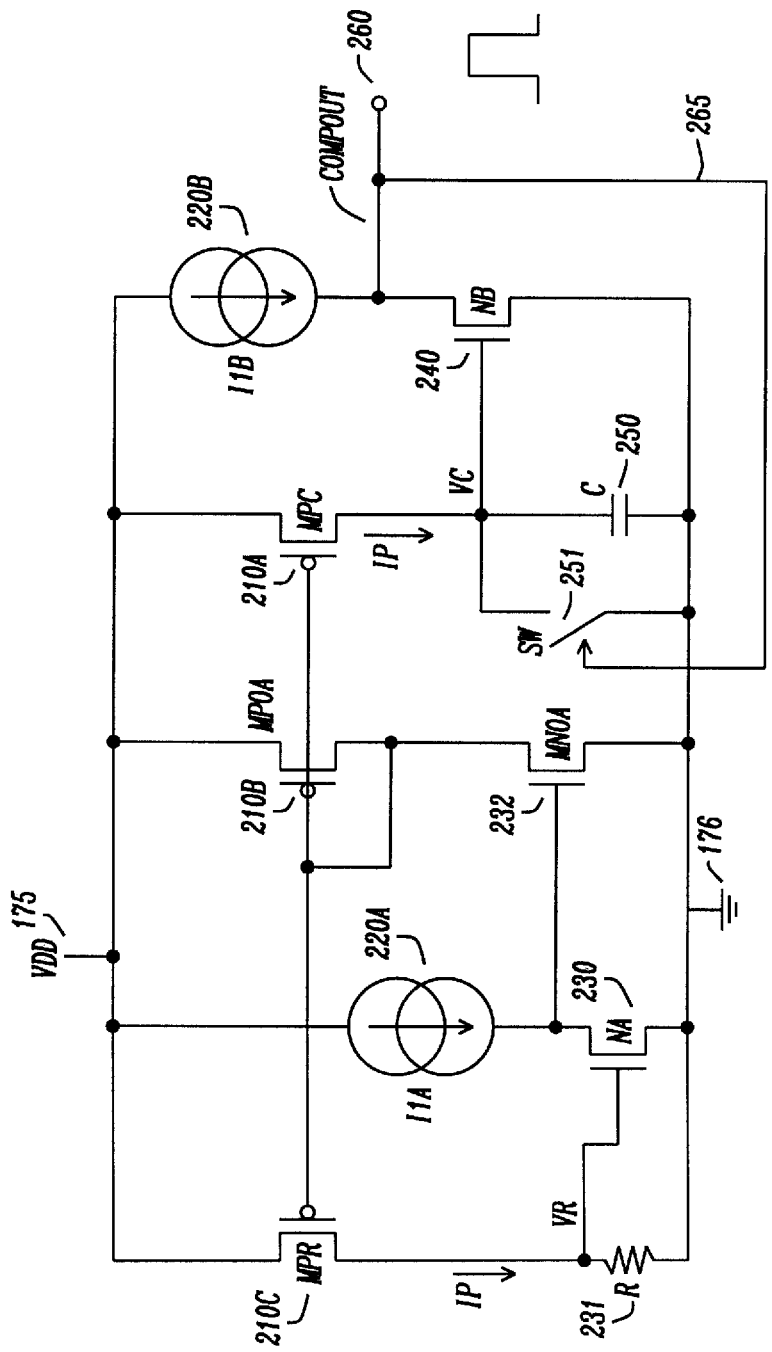
FIG. 6 is a circuit schematic of an oscillator in accordance with a fourth embodiment of the disclosure.

FIG. 6 is a circuit schematic of an oscillator in accordance with a fourth embodiment of the disclosure. The circuit is sourced by power supply VDD 175, and ground supply 176. P-channel MOSFET transistor MPC 210A, MPOA 210B, and MPR 210C form a current mirror source for the circuit. The transistor MPC 210A provides current IP. The transistor MPR 210C also provides current IP. The current source 220A provides the current I1A to the gate of re-channel MOSFET device MNOA 232. An additional capacitor element, in parallel with the MOSFET MNOA 232, can be added between the gate of the n-channel MOSFET device MNOA 232 and ground connection 176. The current source 220B provides current I1B for the output of the oscillator COMPOUT (oscillator out). Transistor 210C sources current IP to resistor element R 231 and n-channel MOSFET NA 230. Transistor MPC 210A sources a replica current IP to n-channel MOSFET NB 240 as well as the parallel configuration of capacitor 250 and switch 251. A feedback loop 265 is electrically connecting the oscillator output 260 and activates the switch 251.

Current sources can lead to significant variation. A very poor (300% variation) current source is used for the matched pull-ups I1A and I1B that have the same values. These currents are injected into matched NMOS NA 230 and NMOS NB 240. The branch {MNOA, MPGA} acts as a single-branch operational amplifier as follows:

For low current IP, the gate voltage on MOSFET NA 230, VR, is low, and MOSFET NA 230 is not able to drive current source I1A 220A. When the gate of MNOA 232 rises up, and transistor MNOA 232 adjusts the current in transistor MPOA 210B, then a copy is formed on transistor MPR 210C; this regulates the current IP such that the current in MOSFET NA 230 I(NA)=I1A. Thus, the current, IP=VGSNA(I1A)/R.

The current regulated by the transistor MPOA 210B is also copied onto transistor MPC 210A and injected into the capacitor C 250. The current is equal to the derivative of the voltage on the capacitor with respect to time, (e.g. IP=dVC/dt) as well as also equal to the gate to source voltage of MOSFET NA 230 divided by the resistor R 231, VGSNA(IP)/R.

The capacitor voltage, VC, increases, and eventually reaches the value VGSNA(IP) after the time t=T. This can be expressed as IP=VGSNA(IP)/R, also=C.VGSNA(IP)/T and thus T=RC. At this time, the transistor NB 240 is matched with transistor NA 230, then transistor NB 240 carries the current I1B just transistor NA 230 carries current I1A. This condition corresponds to the tripping point for COMPOUT 260 The oscillator out COMPOUT 260 voltage value decrease can be used to generate a reset pulse to set capacitor voltageVC back to 0V, and restart a T-duration cycle.

Without the need of reference voltage, VREF, or any precise current, a switching frequency F=1/(RC) is obtained with the other process effects (transistors and bias currents) being cancelled assuming a good matching of the components.

Figure 7:
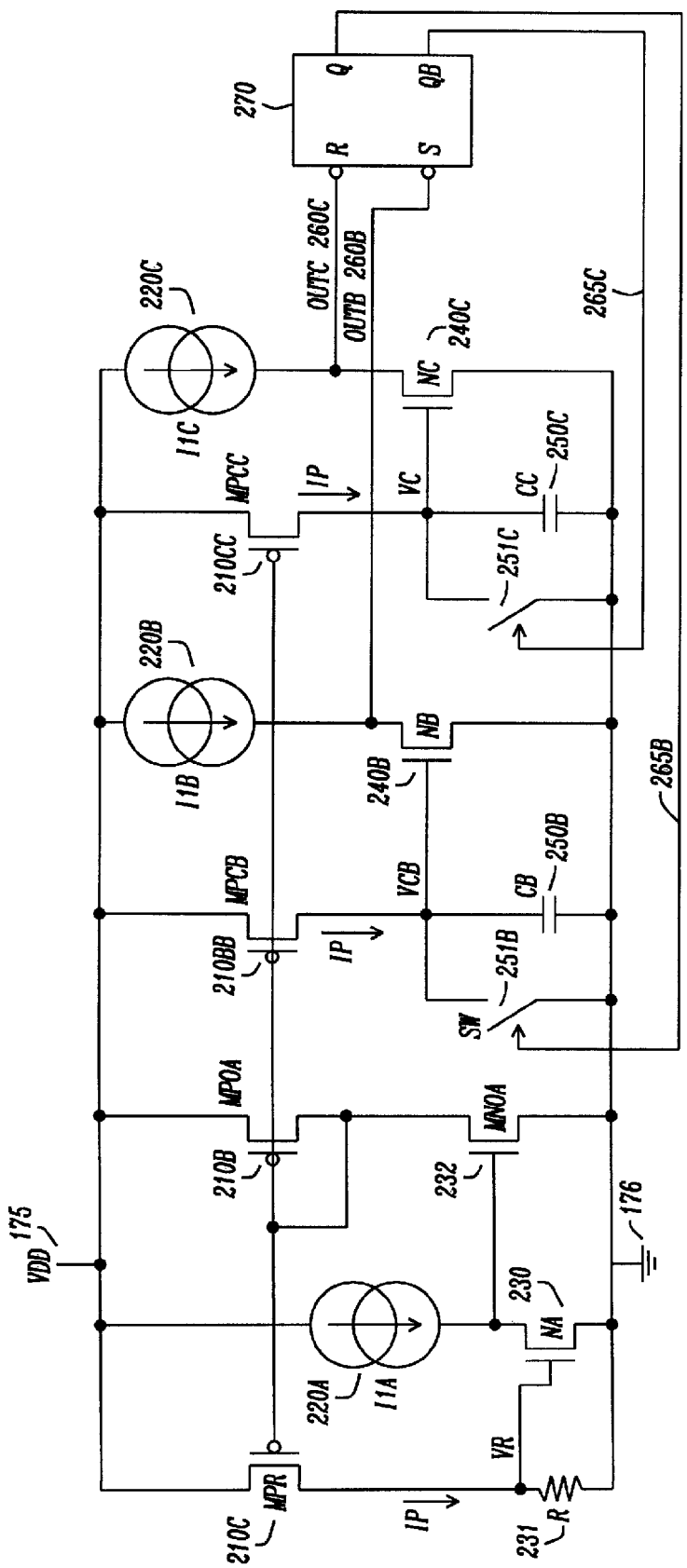
FIG. 7 is a circuit schematic of an oscillator in accordance with a fifth embodiment of the disclosure.

FIG. 7 is a circuit schematic of an oscillator in accordance with a fifth embodiment of the disclosure. The circuit is sourced by power supply VDD 175, and ground supply 176. P-channel MOSFET transistor MPCB 210BB, MPOA 210B, and MPR 210CC form a current mirror source for the circuit. The transistor MPC 210BB and MPCC 210CC provides current IP. The transistor MPR 210C also provides current IP. The current source 220A provides the current I1A to the gate of n-channel MOSFET device MNOA 232. The current source 220B provides current I1B for the output of the oscillator OUTB 260B. Transistor 210C sources current IP to resistor element R 231 and n-channel MOSFET NA 230. Transistor MPCB 210BB sources a replica current IP to the gate of the n-channel MOSFET NB 240B as well as the parallel configuration of capacitor 250B and switch 251B. A feedback loop 265 B is electrically connected to QB of S-R flip-flop 270 and activates the switch 251B. The current source 220C provides current I1C for the output of the oscillator OUTC 260C. Transistor MPCC 210CC sources a replica current IP to the gate of the n-channel MOSFET NC 240C as well as the parallel configuration of capacitor 250C and switch 251C. A feedback loop 265C is electrically connected to Q of S-R flip-flop 270 and activates the switch 251C.

In practice, and similarly to the relaxation oscillators (FIG. 2), the C-branches are duplicated to cancel the frequency drift that would come from the reset-pulse duration. The final implementation is depicted in the FIG. 7. The generation of IP=VGSNA(I1)/R current reference. This current IP is copied twice onto two capacitor branches, to generate two saw-teeth voltage of capacitor B, VCB and voltage of capacitor C, VCC. When the voltage of capacitor B, VCB is ramped, then VCC is reset (stuck to 0V) and vice versa. When the voltage of capacitor B VCB reaches VGSNA(I1)/R, then the signal OUTB 260B goes to a low state, and sets the latch: Q=1 sticks the capacitor voltage, VCB, to 0V, and QB=0 releases the capacitor voltage VCC that ramps up (e.g. rises).

A similar calculation shows that all the process dependences are cancelled (at exception of R, C) assuming that transistors NA 230, NB 240B, and NC 240C are properly matched, as well as I1A 220A, I1B 220B, and I1C 220C.

This invention can also profit from trimming, because R can be a temperature compensated polysilicon resistor, and C has a very low temperature coefficient. Post-trimming achievable total spread can be as low as [−5%; +5%].

Figure 8:
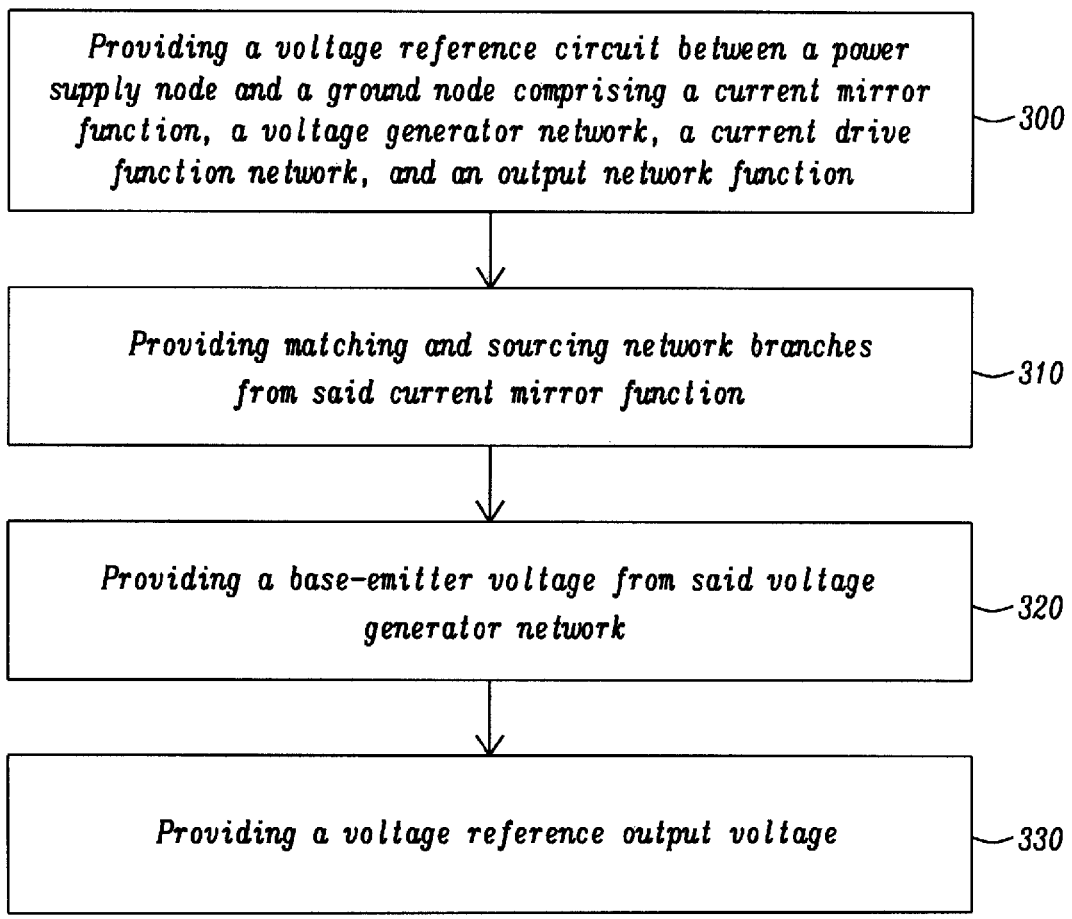
FIG. 8 is a method for providing a voltage reference circuit in accordance with an embodiment of the disclosure; and, FIG. 9 is a method for providing an oscillator in accordance with an embodiment of the disclosure.

FIG. 8 is a method for providing a voltage reference circuit in accordance with an embodiment of the disclosure. A method for a voltage reference circuit consists of a first step (1) providing a voltage reference circuit between a power supply node and a ground node comprising a current mirror function, a voltage generator network, a current drive function network, and an output network function 300, a second step (2) providing matching and sourcing network branches from the current mirror function 310, a third step (3) providing a base-emitter voltage from the voltage generator network 320, and a fourth step (4) providing a voltage reference output voltage 330.

Figure 9:
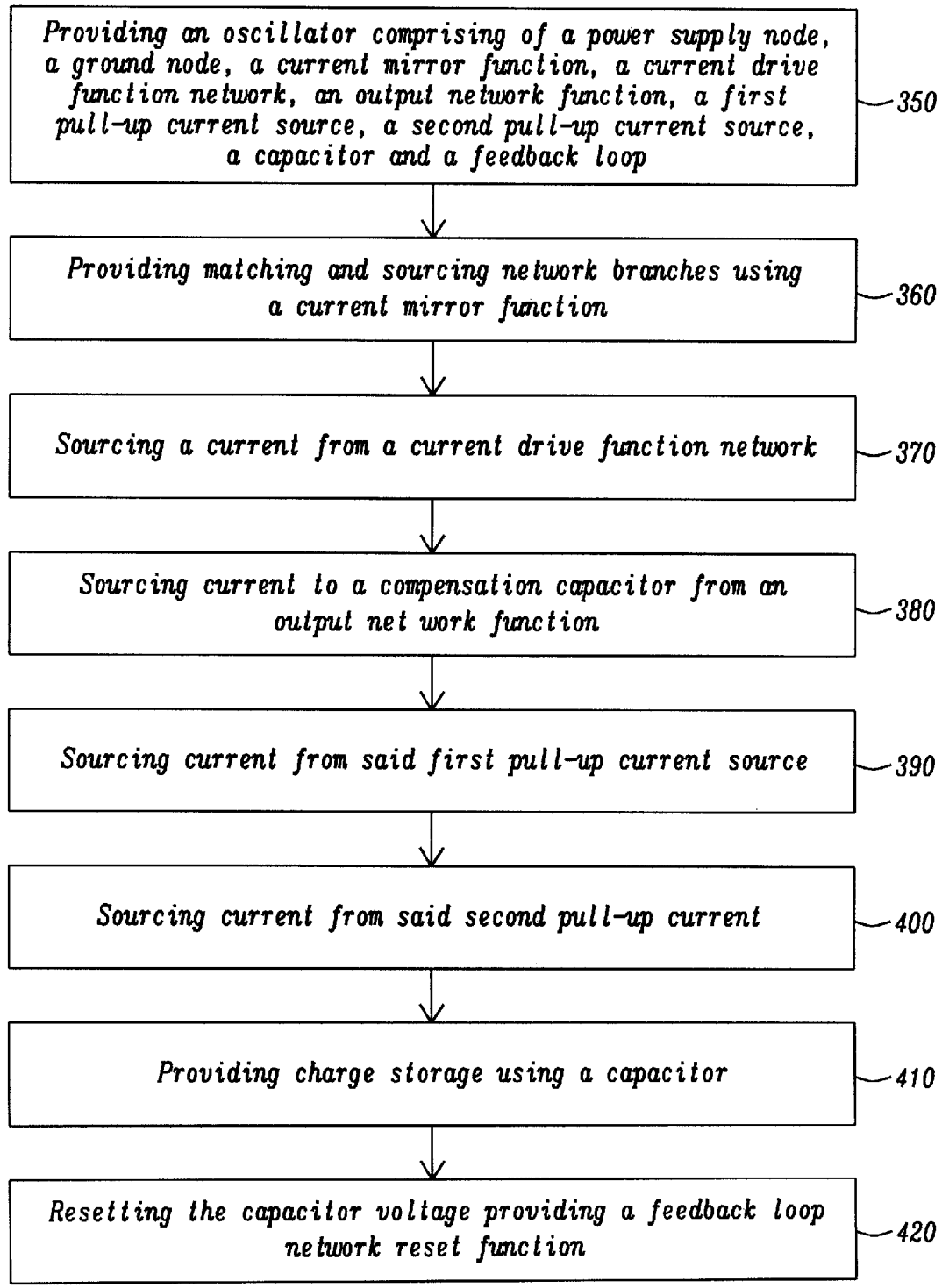

FIG. 9 is a method for providing an oscillator in accordance with an embodiment of the disclosure. The steps comprise of a first step (1) providing an oscillator comprising of a power supply node, a ground node, a current mirror function, a current drive function network, an output network function, a first pull-up current source, a second pull-up current source, a capacitor, and a feedback loop 350, a second step (2) providing matching and sourcing network branches using a current mirror function 360, a third step (3) sourcing a current from a current drive function network 370, a fourth step (4) sourcing current to a capacitor from an output network function 380, a fifth step (5) sourcing current from the first pull-up current source 390, a sixth step (6) sourcing current from the second pull-up current source 400, a seventh step (7) providing charge storage using a capacitor 410, and the last step (8) resetting the capacitor voltage providing a feedback loop network reset function 420.

Equivalent embodiments can utilize bipolar elements in place of the MOSFET elements in the circuit. An additional embodiment can utilize pnp bipolar transistors instead of the p-channel MOSFET devices. An additional embodiment can utilize npn bipolar junction transistors (BJT) instead of n-channel MOSFET devices.

Other advantages will be recognized by those of ordinary skill in the art. The above detailed description of the disclosure, and the examples described therein, has been presented for the purposes of illustration and description. While the principles of the disclosure have been described above in connection with a specific device, it is to be clearly understood that this description is made only by way of example and not as a limitation on the scope of the disclosure.

What is claimed is:

1. A voltage reference circuit between a power supply node and a ground node and configured for generating a reference voltage, comprising:

a current mirror function providing matching and sourcing network branches wherein a first p-channel MOSFET sources current;

a voltage generator network sourced from said current mirror providing a base-emitter voltage wherein said first p-channel MOSFET sources current to said voltage generator network;

a current drive function network electrically sourced from said current mirror function wherein a second p-channel MOSFET sources current for said current drive function;

an output network function sourced from said current mirror providing a voltage reference output voltage;

a first n-channel MOSFET device providing a base-emitter voltage (VBE);

wherein said current mirror function further comprises a third p-channel MOSFET which sources current for said output network function, and a fourth p-channel MOSFET which sources current for said voltage generator network; and wherein said voltage generator network comprises:

a first resistor element electrically coupled to the gate of said first n-channel MOSFET device;

a second resistor element electrically coupled to the gate of said first n-channel MOSFET device providing a PTAT function; and, a second n-channel MOSFET device whose MOSFET gate and MOSFET drain are electrically coupled to said second resistor element.

2. The circuit of claim 1 wherein said second n-channel MOSFET device has a MOSFET width which is N times larger than the MOSFET width of said first n-channel MOSFET.

3. The circuit of claim 2 wherein said current drive network further comprises a third n-channel MOSFET whose MOSFET gate is electrically coupled to the MOSFET drain of said first n-channel transistor and sourced from said current mirror function.

4. The circuit of claim 3 wherein said output network function provides an output voltage reference further comprising a third resistor element electrically sourced from said current mirror network.

5. The circuit of claim 4 further comprising a start-up system providing a stable non-zero bias state.

6. The circuit of claim 5 wherein said start-up system comprises:

A fifth p-channel MOSFET device whose gate is electrically connected to said current mirror function, sourcing current for said start-up system;

a device element electrically coupled to the fifth p-channel MOSFET device drain;

a sixth p-channel MOSFET device whose gate is electrically coupled to said fifth p-channel MOSFET device and said device element wherein said device element can be an inherent resistor, parasitic resistor, and/or a current source, and whose drain is electrically connected to the drain of said first n-channel MOSFET device; and a compensation capacitor providing stability for said start-up system and said voltage reference circuit.

7. A voltage reference circuit between a power supply node and a ground node and configured for generating a reference voltage, comprising:

a current mirror function providing matching and sourcing network branches;

a voltage generator-current mirror replica function network sourced from said current mirror providing a base-emitter voltage;
a current drive function network electrically sourced from said current mirror function;
a current feedback sub-loop function;
an output network function sourced from said current mirror providing a voltage reference output voltage electrically coupled to said current feedback sub-loop function.

8. The voltage reference circuit of claim 7 wherein said current mirror function comprises:
a first p-channel MOSFET sourcing current for said voltage generator network;
a second p-channel MOSFET sourcing current for said current drive function network;
a third p-channel MOSFET sourcing current for said output network function; and
a fourth p-channel MOSFET sourcing current to said voltage-generator-current mirror replica function.

9. The voltage reference circuit of claim 8 wherein said circuit comprises:
a first n-channel MOSFET device providing a VBE voltage;
a first resistor element electrically coupled to the gate of said first n-channel MOSFET device;
a second resistor element electrically coupled to the gate of said first n-channel MOSFET device providing a PTAT function;
a second n-channel MOSFET device whose MOSFET gate and MOSFET drain are electrically coupled to said second resistor; and,
a third n-channel MOSFET device is sourced from said current mirror function and whose gate is electrically coupled to said second n-channel MOSFET gate forming a current mirror with said second n-channel MOSFET.

10. The voltage reference circuit of claim 9 wherein said first n-channel MOSFET size is N times smaller than said second n-channel MOSFET.

11. The voltage reference circuit of claim 10 wherein said current drive network further comprises a fourth n-channel MOSFET whose MOSFET gate is electrically coupled to the MOSFET drain of said first n-channel transistor and sourced from said current mirror function.

12. The voltage reference circuit of claim 11 wherein said current feedback sub-loop function further comprises:
a fifth p-channel MOSFET electrically coupled to the power supply VDD and whose gate and drain are electrically coupled to provide an "on-state;
a sixth p-channel MOSFET providing a sub-operational amplifier forming a local loop whose gate is coupled forming a current mirror with said fifth p-channel MOSFET and said third p-channel MOSFET; and
a fifth n-channel MOSFET whose source is coupled said fifth p-channel MOSFET gate and drain, and whose gate is coupled to fourth p-channel MOSFET and third n-channel MOSFET.

13. An oscillator circuit between a power supply node and a ground node and configured for generating an oscillating signal, comprising:
a current mirror function providing matching and sourcing network branches;
a current drive function network electrically sourced from said current mirror function;
an output network function sourced from said current mirror providing a capacitor generated voltage ramp;
a first pull-up current source connected to said current drive function;
a second pull-up current source connected to an output network function;
a capacitor providing voltage ramp and output network function; and,
a feedback loop network providing reset function.

14. The oscillator circuit of claim 13 wherein said current mirror function comprises:
a first p-channel MOSFET whose gate and drain are electrically coupled providing current to said output network function;
a second p-channel MOSFET providing a current source for said capacitor; and
a third p-channel MOSFET providing a replica current to said output network function.

15. The oscillator circuit of claim 14 wherein said current drive function comprises:
a first n-channel MOSFET; and
a second n-channel MOSFET whose MOSFET gate is electrically coupled to said MOSFET drain of said first n-channel transistor and sourced from said current mirror function.

16. The oscillator circuit of claim 15 wherein said output network function comprises said second pull-up current source and further comprising a third n-channel MOSFET whose MOSFET gate is connected to said capacitor.

17. The oscillator circuit of claim 16 wherein said feedback loop network is electrically coupled to the oscillator out signal and further comprises a switch.

18. The oscillator circuit of claim 17 wherein said switch is in parallel with said capacitor, providing a reset function.

19. An oscillator circuit between a power supply node and a ground node and configured for generating an oscillating signal, comprising:
a current mirror function providing matching and sourcing network branches;
a current drive function network electrically sourced from said current mirror function;
a first capacitor providing charge storage;
a second capacitor providing charge storage;
a first output network function sourced from said current mirror providing a first capacitor generated voltage ramp;
a second output network function sourced from said current mirror providing a second capacitor generated voltage ramp;
a first pull-up current source connected to said current drive function;
a second pull-up current source connected to a first output network function;
a third pull-up current source connected to a second output network function;
a S-R flip-flop whose inputs are from said first output network function and said second output network function;
a first feedback loop network connected to said first output of said S-R flip-flop providing reset function for a first switch; and
a second feedback loop network connected to said second output of said S-R flip-flop providing reset function for a second switch.

20. A method for a voltage reference circuit comprising the steps of:
providing a voltage reference circuit between a power supply node and a ground node comprising a current mirror function, a voltage generator network, a current drive function network, and an output network function;

providing matching and sourcing network branches from said current mirror function;

providing a base-emitter voltage from said voltage generator network;

providing a voltage reference output voltage;

and providing a feedback loop network providing a reset function.

21. The method of claim 20 further comprising a startup system.

22. The method of claim 21 further comprising a compensation capacitor.

23. A method for an oscillator circuit comprising the step of:

providing an oscillator comprising of a power supply node, a ground node, a current mirror function, a current drive function network, an output network function, a first pull-up current source, a second pull-up current source, a capacitor, and a feedback loop;

providing matching and sourcing network branches using a current mirror function;

sourcing a current from a current drive function network;

sourcing current from said first pull-up current source;

sourcing current from said second pull-up current source;

providing charge storage using a capacitor; and resetting the capacitor voltage providing a feedback loop network reset function.

24. The method of claim 23 further comprising of a second output network function, a third pull-up current source, a second capacitor, a second feedback loop, and a S-R flip-flop network, further comprising:

sourcing current from said third pull-up current source;

providing charge storage using a second capacitor; and resetting the second capacitor voltage providing a second feedback loop reset function.

* * * * *